US009264007B2

(12) United States Patent  
Tamaki

(10) Patent No.: US 9,264,007 B2  
(45) Date of Patent: Feb. 16, 2016

(54) NOISE FILTER AND TRANSMISSION DEVICE

(75) Inventor: Hiroto Tamaki, Yashio (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 239 days.

(21) Appl. No.: 13/822,789

(22) PCT Filed: Sep. 16, 2011

(86) PCT No.: PCT/JP2011/005243  
§ 371 (c)(1),  
(2), (4) Date: Mar. 13, 2013

(87) PCT Pub. No.: WO2012/039119  
PCT Pub. Date: Mar. 29, 2012

(65) Prior Publication Data  
US 2013/0169380 A1 Jul. 4, 2013

(30) Foreign Application Priority Data

Sep. 24, 2010 (JP) ................................ 2010-214396

(51) Int. Cl.
| | |
|---|---|
| *H03H 7/09* | (2006.01) |
| *H04B 3/30* | (2006.01) |
| *H03H 1/00* | (2006.01) |
| *H04B 3/00* | (2006.01) |
| *H04B 3/02* | (2006.01) |

(Continued)

(52) U.S. Cl.  
CPC ............. *H03H 1/0007* (2013.01); *H03H 7/427* (2013.01); *H04B 3/00* (2013.01); *H04B 3/02* (2013.01); *H04B 3/30* (2013.01); *H04L 12/40032* (2013.01); *H03H 7/09* (2013.01); *H03H 7/1725* (2013.01); *H03H 7/1758* (2013.01);

(Continued)

(58) Field of Classification Search  
CPC ....... H03H 1/0007; H03H 7/09; H03H 7/427; H03H 7/1758; H03H 7/1725; H03H 7/1766; H03H 7/1791; H04B 3/30; H04L 12/40032  
USPC ............................................. 333/4, 5, 12, 181  
See application file for complete search history.

(56) References Cited

U.S. PATENT DOCUMENTS 4,594,648 A * 6/1986 Gallios .......................... 363/46  
2007/0252659 A1 11/2007 Suenaga  
(Continued)

FOREIGN PATENT DOCUMENTS

CN 101123136 A 2/2008  
JP H09-116367 A 5/1997

*Primary Examiner* — Benny Lee  
*Assistant Examiner* — Rakesh Patel  
(74) *Attorney, Agent, or Firm* — Canon USA, Inc. IP Division

(57) ABSTRACT

A noise filter can reliably reject an in-phase component included in a differential signal without generating anti-resonance at a target frequency reject and, a transmission device including such a noise filter.  
Ends of a pair of coils are connected to a pair of transmission lines in the vicinity of the transmitting circuit, and other ends are short-circuited. The coils are magnetically coupled so that the magnetic flux is cancelled regarding the in-phase component that transmits the pair of transmission lines, and the magnetic flux is increased regarding an opposite-phase component that transmits the pair of transmission lines. A series circuit, which includes an inductor and a capacitor connected in series, is connected to the pair of coils and ground. Each value of the pair of coils, the inductor, and the capacitor is set so that a resonance frequency of the in-phase component is a target frequency.

9 Claims, 9 Drawing Sheets

(51) Int. Cl.
*H04L 12/40* (2006.01)
*H03H 7/42* (2006.01)
*H03H 7/01* (2006.01)

(52) U.S. Cl.
CPC ............ *H03H7/1766* (2013.01); *H03H 7/1791* (2013.01); *H03H 2007/013* (2013.01)

(56) References Cited

U.S. PATENT DOCUMENTS

2009/0240994 A1 9/2009 Lee
2012/0049985 A1* 3/2012 Kawai et al. ................ 333/22 R

* cited by examiner

NOISE FILTER AND TRANSMISSION DEVICE

TECHNICAL FIELD

The present invention relates to a noise filter used for a differential transmission system applied to electrical and electronic equipment or control equipment, and a transmission device including the noise filter.

BACKGROUND ART

In recent years, since the demand for high speed processing and high definition content is high, digital MFPs and digital cameras are required to be able to transmit a great number of digital signals at a high speed while satisfying the waveform quality. In order to transmit such high-volume data at a high speed, it is necessary to increase the number of transmission lines or increase the transmission speed. However, since electronic substrates are miniaturized and are extremely dense, it is difficult to increase the number of transmission lines.

Further, when data is transmitted via a cable, the number of cable cores directly affects the cost. Further, according to the increase in the transmission speed, variation in timing of signals due to skew is increased. Accordingly, keeping the set up/hold time becomes difficult. Thus, serial transmission which can transmit large volumes of data at high speed with a small number of transmission lines is widely used.

According to the serial transmission system, low-speed parallel signals such as data signals, address signals, and control signals are serialized and are differentially output to the transmission line. The transmitted serial signals are deserialized on the receiving side so that parallel signals are obtained. As the serial transmission system, US2009-0240994 discusses two types of transmission methods.

The first transmission method is clock synchronous serial transmission. A reference clock signal is transmitted along with several pieces of serialized data. According to this system, since the reference clock signal is transmitted along with the serialized data, synchronization of the reference clock signal and each data signal is very important. Thus, skew of each signal pair needs to be minimized.

The second method is clock-embedded serial transmission. According to this method, a clock bit is added to a serialized data stream and a clock signal is embedded in the data stream. The clock signal and the data signal are recovered on the receiving side. According to this transmission system, since the clock signal is embedded in the data stream, the synchronization condition will be more flexible compared to the condition of the clock signal for the data signal of the clock synchronous serial transmission.

If a high speed signal is transmitted through a long transmission cable that produces power loss, a portion of the signal component may be radiated, having the cable working as an antenna, and affect operations of other apparatuses. Thus, it is necessary to reduce electromagnetic interference (EMI) of the apparatus.

Especially, regarding differential transmission, in some cases, an in-phase component, which is generated according to the waveform difference at the rising edge and the falling edge of the transmitted differential signal, passes through the system ground when it returns. In such a case, a large loop antenna, which causes problems, is generated. Since rejecting of the in-phase component of the differential signal on the driver side leads to small antenna size, it is important to reject the in-phase component in suppressing EMI in the differential transmission.

EMI suppression of clock embedded serial transmission includes the following features. First, a capacitor is inserted in series with the differential transmission line and AC coupling is performed. If a driver and a receiver are connected by a cable, AC coupling is effective in removing the DC electric potential difference of the ground electric potential between the systems. Further, the AC coupling can reduce the threshold difference when the driver and the receiver are products of different manufacturers.

It is important that DC level is kept constant when the AC coupling is performed. Thus, data which is transmitted is coded according to conversion table or by a mathematical expression. This is to set the logical transition data rate between the high level and the low level to 50%. Accordingly, the serial data to be transmitted at the low level or at the high level is not continued for 3 to 4 bits or more.

Thus, regarding EMI from a serial transmission system including a differential transmission line, the level transition of the differential signal is likely to occur in 1 bit period. If such level transition occurs, since an in-phase component, having an integral multiple of 1 bit period, is generated, greater EMI is observed at a frequency of one bit period.

Further, data spectrum transmitted in a square wave is expressed by a sinc function. It is known that a frequency of an integral multiple of one bit period does not have a spectrum. In other words, strong EMI is generated at a frequency where a spectrum of an opposite-phase component of a differential signal is null. For example, if the transmission data rate is 400 Mbps, 1 bit period will be 400 MHz, and no transmission signal spectrum will be seen at the integral multiple. Accordingly, strong EMI is generated.

As an EMI suppression method for the clock embedded serial transmission system, since the EMI occurs at the frequency where an opposite phase signal spectrum necessary in the transmission is null, for example, a band elimination filter or a notch filter is added to the differential transmission line. Since the band elimination filter and the notch filter are useful in rejecting the frequency band where the opposite phase signal spectrum necessary in the differential transmission does not exist, it can efficiently reject the in-phase component which causes EMI with a minimal effect on the transmission signal spectrum.

Thus, conventionally, a band elimination filter which includes a series circuit of an inductor and a capacitor and is connected in parallel with the transmission line is used. To be more specific, as illustrated in FIG. 6A, a pair of transmission lines $107a$ and $107b$ is connected to series circuits $106_1$ and $106_2$ including inductors $102_1$ and $102_2$ and capacitors $103_1$ and $103_2$. According to each of the series circuits $106_1$, $106_2$, LC resonant circuits are formed. "Microwave Filters, Impedance-Matching Networks, and Coupling Structures" (G. Matthaei/L. Young E. M. T. Jones ISBN: 0-89006-099-1, P725 to P772))

CITATION LIST

Patent Literature

PTL 1: US2009-0240994

Non Patent Literature

NPL 1: "Microwave Filters, Impedance-Matching Networks, and Coupling Structures" (G. Matthaei/L. Young E. M. T. Jones ISBN: 0-89006-099-1, P725 to P772)

SUMMARY OF INVENTION

Technical Problem

The inductors $102_1$ and $102_2$ and the capacitors $103_1$ and $103_2$ of the series circuits $106_1$ and $106_2$ are generally chip components. Chip components generally include precision error of +−5%. Thus, variation in resonance frequencies $f_1$ and $f_2$ occurs between the series circuits $106_1$ and $106_2$ arranged on the differential transmission line.

Thus, as illustrated in FIG. 6B, if the resonance frequencies $f_1$ and $f_2$ of the series circuits $106_1$ and $106_2$ are generated on the high and the low frequency sides of the target resonance frequency, antiresonance occurs at the target resonance frequency. If this antiresonance occurs, the effect for rejecting the noise being the in-phase component will be reduced.

The present invention relates to a noise filter which can reject an in-phase component of a differential transmission line without causing antiresonance at a desired frequency, and a transmission device using such a noise filter.

Solution to Problem

According to an aspect of the present invention, a noise filter provided on a pair of transmission lines connecting a transmitting circuit configured to transmit a differential signal and a receiving circuit configured to receive the differential signal includes a pair of coils and an inductor and a capacitor. One end of one coil of the pair of coils is connected to one transmission line of the pair of transmission lines in the vicinity of the transmitting circuit, one end of the other of the pair of coils is connected to the other transmission line of the pair of transmission lines in the vicinity of the transmitting circuit, other ends of the pair of coils are short-circuited, and a state of the pair of coils is in such a magnetic coupling state that a magnetic flux of an in-phase component that transmits the pair of transmission lines is cancelled and a magnetic flux of an opposite-phase component that transmits the pair of transmission lines is increased. The inductor and the capacitor are a series circuit connected in series with the pair of coils and the ground, a combined inductance value of an effective inductance of the in-phase component of the pair of coils and the inductance of the inductor, and a capacitance value of the capacitor are set to such values that a resonance frequency of the in-phase component of the pair of coils and the series circuit is controlled as a target frequency.

According to an aspect of the present invention, a transmission device includes a transmitting circuit, a receiving circuit, a transmission line configured to connect the transmitting circuit and the receiving circuit and transmit a differential signal, and a noise filter provided on the transmission line. The noise filter includes a pair of coils and an inductor and a capacitor, and one end of one coil of the pair of coils is connected to one transmission line of the pair of transmission lines in the vicinity of the transmitting circuit, one end of the other of the pair of coils is connected to the other transmission line of the pair of transmission lines in the vicinity of the transmitting circuit, other ends of the pair of coils are short-circuited, and a state of the pair of coils is in such a magnetic coupling state that a magnetic flux of an in-phase component that transmits the pair of transmission lines is cancelled and a magnetic flux of an opposite-phase component that transmits the pair of transmission lines is increased. The inductor and the capacitor are a series circuit connected in series with the pair of coils and the ground, a combined inductance value of an effective inductance of the in-phase component of the pair of coils and the inductance of the inductor, and a capacitance value of the capacitor are set to such values that a resonance frequency of the in-phase component of the pair of coils and the series circuit is controlled as a target frequency.

Further features and aspects of the present invention will become apparent from the following detailed description of exemplary embodiments with reference to the attached drawings.

DESCRIPTION OF EMBODIMENTS

Various exemplary embodiments, features, and aspects of the invention will be described in detail below with reference to the drawings.

Example 1

Figure 1:
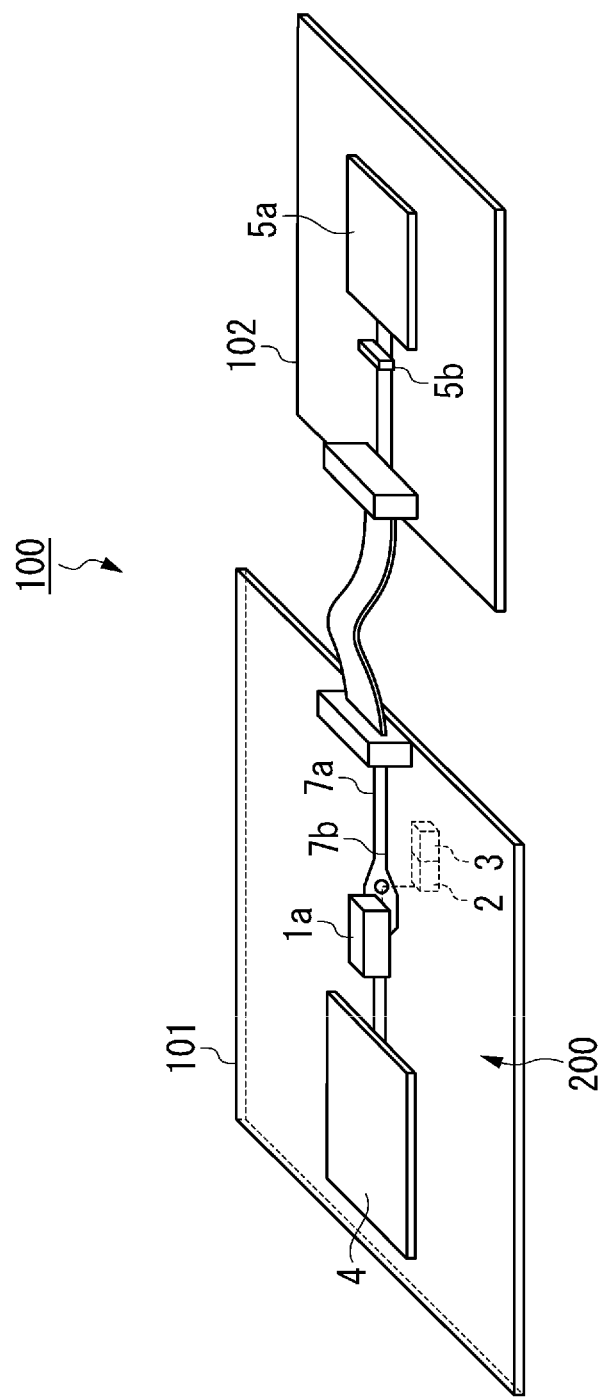
FIG. 1 is a schematic diagram of a transmission device according to a first exemplary embodiment.

FIG. 1 is a schematic diagram illustrating a configuration of a transmission device including a noise filter according to a first exemplary embodiment of the present invention. A transmission device 100 of the present exemplary embodiment performs clock embedded serial transmission by adding a clock bit to a serialized data stream, embedding a clock signal in the data stream, and recovering the clock signal and the data signal on the receiving side.

The transmission device 100 according to the first exemplary embodiment includes a first substrate 101, a transmitting circuit 4 mounted on the first substrate 101, a second substrate 102, and a receiving circuit 5a mounted on the second substrate 102. Further, the transmission device 100 includes a pair of transmission lines 7a and 7b which connects the transmitting circuit 4 and the receiving circuit 5a.

Between the pair of transmission lines 7a and 7b and in the vicinity of the receiving circuit 5a (i.e., on the second substrate 102), a differential termination circuit (terminating resistor) 5b is connected to the transmission lines 7a and 7b. Although the receiving circuit 5a and the differential termination circuit 5b are on different chips, the receiving circuit 5a and the differential termination circuit 5b can be realized in one chip.

The transmitting circuit 4 transmits a differential signal to the receiving circuit 5a via the pair of transmission lines 7a and 7b. Each of the transmission lines 7a and 7b includes wiring on each of the first substrate 101 and the second substrate 102 and also a cable connecting the wiring on each of the first substrate 101 and the second substrate 102. Each transmission line can be made only from the wiring on the substrate or a cable, and the form of the transmission line is determined according to the arrangement of the transmitting circuit and the receiving circuit.

Further, the transmission device 100 includes a noise filter 200 connected to the pair of transmission lines 7a and 7b. The noise filter 200 is provided on the first substrate 101 in the vicinity of the transmitting circuit 4.

Figure 2A:
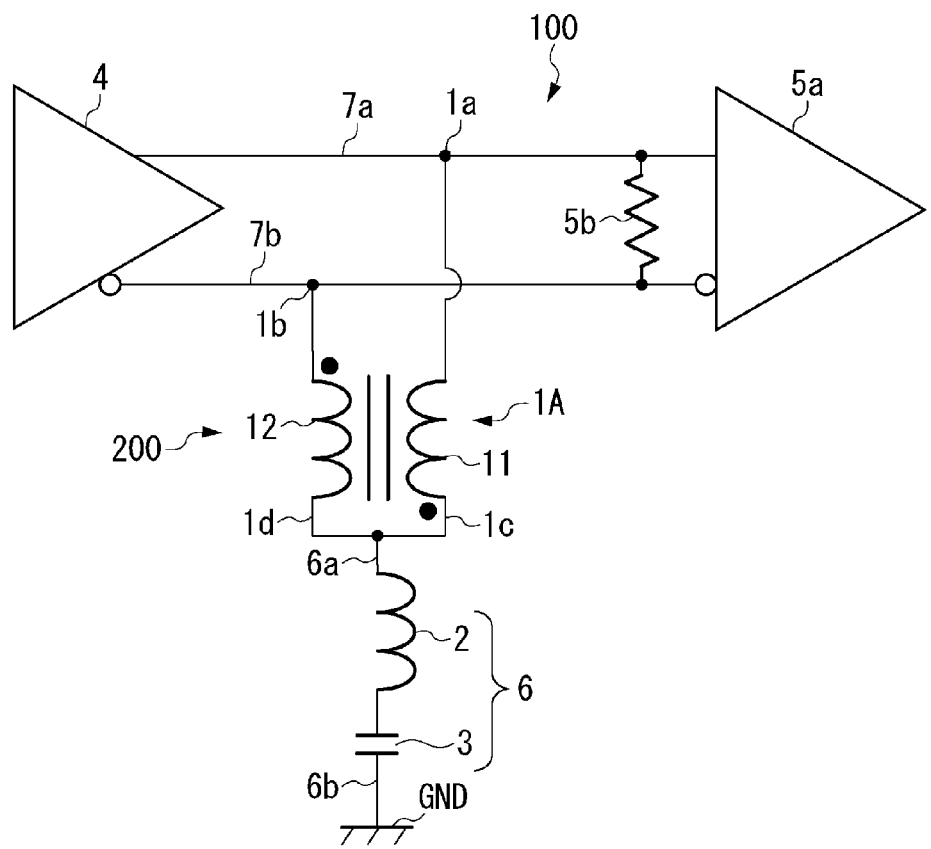
FIG. 2A is a circuit diagram of the transmission device according to the first exemplary embodiment.
Figure 2B:
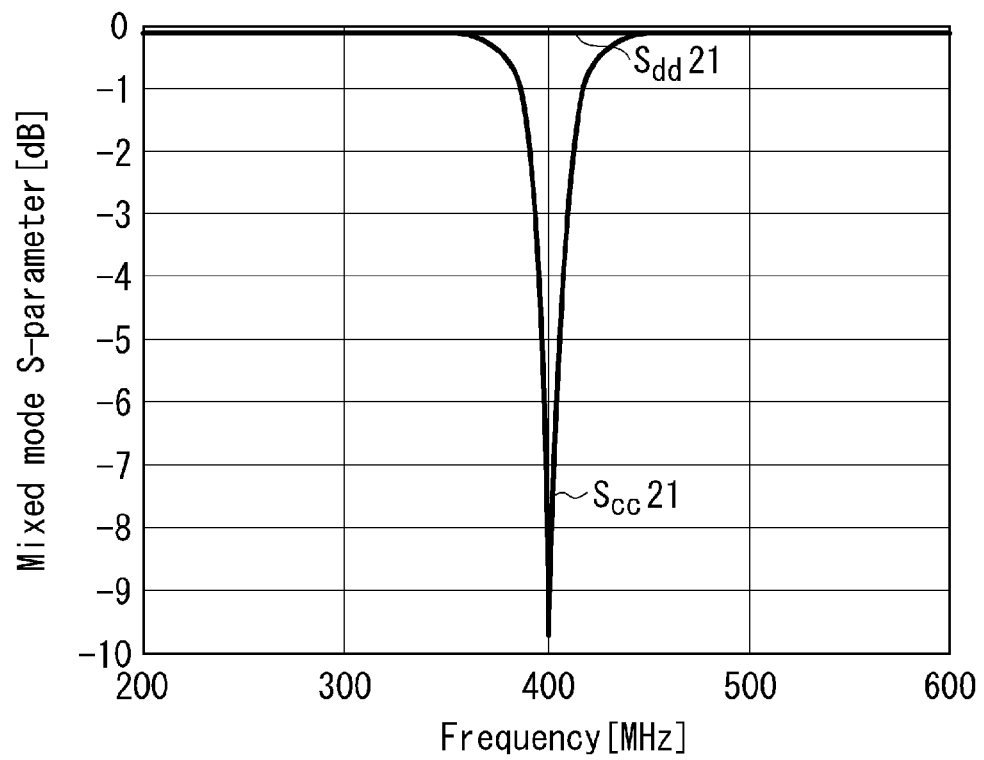
FIG. 2B is a graph illustrating a calculation result of mixed-mode s-parameters of the transmission device according to the first exemplary embodiment.

FIGS. 2A and 2B are schematic diagrams of the transmission device 100 including the noise filter 200. FIG. 2A is a circuit diagram of the transmission device 100 including the noise filter 200. As illustrated in FIG. 2A, the noise filter 200 includes a four-terminal circuit 1A including a pair of coils 11 and 12.

One end (end 1a) of the coil 11 is connected to the transmission line 7a in the vicinity of the transmitting circuit 4 and one end (end 1b) of the coil 12 is connected to the transmission line 7b in the vicinity of the transmitting circuit 4. The other end of the coil 11 (end 1c) and the other end of the coil 12 (end 1d) are short-circuited.

Further, the noise filter 200 includes a series circuit 6 including an inductor 2 and a capacitor 3 which are connected in series. The series circuit 6 is provided between the pair of coils 11 and 12 (the four-terminal circuit 1A) and the GND. In other words, one end 6a of the series circuit 6 is connected to the ends 1c and 1d of the pair of coils 11 and 12, and the other end of the series circuit 6 (end 6b) is connected to the GND. The GND is ground pattern provided on the first substrate 101 (see FIG. 1).

Regarding a differential signal that passes through the pair of transmission lines 7a and 7b, an opposite-phase component is a signal component included in the differential signal and an in-phase component is a noise component included in the differential signal. Thus, in order to enable the four-terminal circuit 1A to function as a differential mode filter, the coils 11 and 12 are wound in the winding directions illustrated in FIG. 2A.

Accordingly, the pair of coils 11 and 12 is in a magnetic coupling state. The magnetic flux is cancelled out regarding the in-phase component which is transmitted through the pair of transmission lines 7a and 7b and increased regarding the opposite-phase component which is transmitted through the pair of transmission lines 7a and 7b.

To be more specific, where a self inductance of the coil 11 is $L_1$, a self inductance of coil 12 is $L_2$, and a mutual inductance between the coils 11 and 12 is M, an effective inductance of the pair of coils 11 and 12 is expressed as $L_1+L_2+-2M$.

Further, the effective inductance of the pair of coils 11 and 12 whose magnetic flux increases with respect to the opposite-phase component that transmits through the pair of transmission lines 7a and 7b is $L_1+L_2+2M$. On the other hand, effective inductance $L_{1A}$ of the pair of coils 11 and 12 whose magnetic flux is cancelled out with respect to the in-phase component that transmits through the pair of transmission lines 7a and 7b is $L_1+L_2-2M$ (=$L_{1A}$).

Thus, regarding the four-terminal circuit 1A including the pair of coils 11 and 12, the impedance of the in-phase component will be lower than the impedance of the opposite-phase component. Further, the impedance of the in-phase component of the four-terminal circuit 1A will be lower than the impedance of the differential termination circuit 5b, and the impedance of the opposite-phase component will be higher than the impedance of the differential termination circuit 5b.

The four-terminal circuit 1A is not limited to the four-terminal circuit described above and any four-terminal circuit can be used so long as the magnetic coupling is that the impedance of the in-phase component of the differential signal is lower than the impedance of the opposite-phase component. For example, a four-terminal circuit having two wires wound around a core or multilayered by a film so that the magnetic flux cancels each other out regarding the in-phase signal components and the magnetic flux increases regarding the opposite phase signal components is used.

Noise reject frequency Fc (i.e., resonance frequency of in-phase component of the pair of coils 11 and 12 and the series circuit 6) of the noise filter 200 is determined according to the following equation (1).

[Math.1]

$$Fc = \frac{1}{2\pi\sqrt{LC}} \quad (1)$$

In the equation, L denotes the combined inductance of the inductance $L_{1A}$ and inductance $L_3$. The inductance $L_{1A}$ is the inductance in the common mode of the four-terminal circuit 1A (inductance of the in-phase component of the pair of coils 11 and 12). The inductance $L_3$ is the inductance of the inductor 2. Further, C denotes the capacitance of the capacitor 3.

Thus, according to the present exemplary embodiment, the combined inductance L and the capacitance C are set to such values that the reject frequency (resonance frequency) Fc becomes the target frequency.

The target frequency is a frequency at which the generated noise can be rejected. In other words, it is the frequency that allows transmission of the in-phase component (noise) to the GND and the frequency where the spectrum of the opposite-phase component of the differential signal is null. For example, if the transmission data rate is 400 Mbps, the target frequency is 400 MHz.

The inductor 2 and the capacitor 3 are not necessarily chip components and can be formed by pattern element. If chip components are used, since chip components generally have a precision error of about +–5%, it is desirable to set the bandwidth to 10% or greater of the reject frequency Fc. The bandwidth BW is determined according to the following equation (2).

[Math.2]

$$BW = \frac{R}{2\pi L} \quad (2)$$

In the equation (2), R is parallel characteristic impedance of the input side and the output side of the noise filter 200 where the pair of transmission lines 7a and 7b being the differential transmission lines are two single end transmission lines. For example, if the characteristic impedance of the input side and the characteristic impedance of the output side are both 50 ohms, R will be 25 ohms.

If the bandwidth BW is determined, the combined inductance L is determined. Further, a value of the capacitance C of the capacitor 3 is determined according to the equation (1). Furthermore, the inductance $L_3$ of the inductor 2 can be obtained by subtracting the inductance $L_{1A}$ of the four-terminal circuit 1A from the inductance L which is determined according to the equation (2).

Additionally, it is desirable to determine the inductance $L_3$ of the inductor 2 while considering equivalent series inductance of the capacitor 3 and the inductance of the pattern element.

FIG. 2B illustrates a simulation result of mixed-mode s-parameters of the electric circuit illustrated in the circuit diagram in FIG. 2A. The transmission data rate is 400 Mbps and the target frequency is 400 MHz. The inductance $L_3$ of the inductor 2 is 37.79 nH and the capacitance of the capacitor 3 is 3.979 pF.

The inductance $L_{1A}$ of the four-terminal circuit 1A in the common mode is 2 nH and the combined inductance L of the inductor 2 and the four-terminal circuit 1A is 39.79 nH. Further, the differential termination circuit (terminating resistance) 5b is 100 ohms. Since the value of the equivalent series inductance of the capacitor 3 is extremely small, it is ignored in the calculation.

Scc21 illustrated in FIG. 2B illustrates a transmission characteristic of the in-phase component from the input side to the output side, in other words, the noise rejecting characteristic. Sdd21 is a transmission characteristic of the opposite-phase component. According to FIG. 2B, although the opposite-phase component is transmitted without being attenuated, the in-phase component is rejected at the band of the target frequency.

According to the noise filter 200 of the first exemplary embodiment, the four-terminal circuit 1A functions so that the impedance between the input and the output is high with respect to the opposite-phase component of the differential signal and is low with respect to the in-phase component of the differential signal.

Since this effect is not changed even if the ends 1c and 1d of the coils 11 and 12 are electrically short-circuited, the impedance of the four-terminal circuit 1A which is parallelly connected to the transmission lines 7a and 7b is sufficiently high compared to the impedance of the differential termination circuit 5b also connected to the transmission lines 7a and 7b. Since the opposite-phase component necessary in the differential transmission is smoothly transmitted to the receiving circuit 5a, it does not affect the signal transmission.

On the other hand, as for the in-phase component which is unnecessary in the differential transmission and which causes EMI, since the pair of coils 11 and 12 are magnetically coupled so that the impedance of the four-terminal circuit 1A is low, the four-terminal circuit 1A can be considered as one coil.

Thus, since the four-terminal circuit 1A works as a resonant circuit for the in-phase component when the capacitor 3 is added in series to the four-terminal circuit 1A, one resonant circuit can be set and antiresonance does not occur at the target frequency. However, since the inductance $L_{1A}$ of the in-phase component of the four-terminal circuit 1A is extremely small, sufficient resonance characteristic is not obtained if only the four-terminal circuit 1A is used.

Thus, according to the present exemplary embodiment, the inductor 2 is added in series with the four-terminal circuit 1A and the capacitor 3. Accordingly, a combined inductor of the four-terminal circuit 1A is realized and a sharper resonance characteristic can be obtained.

In this manner, the opposite-phase component being the differential signal is transmitted to the receiving circuit 5a, and the in-phase component being the noise is transmitted to the GND via the four-terminal circuit 1A and the series circuit 6 in the vicinity of the transmitting circuit 4. Thus, the in-phase component can be rejected and the effect of EMI suppression is improved.

Example 2

Next, the transmission device including the noise filter according to a second exemplary embodiment of the present invention will be described with reference to FIGS. 3A and 3B. According to the present exemplary embodiment, components similar to those in the first exemplary embodiment are denoted by the same reference numerals and their descriptions are not repeated.

Figure 3A:
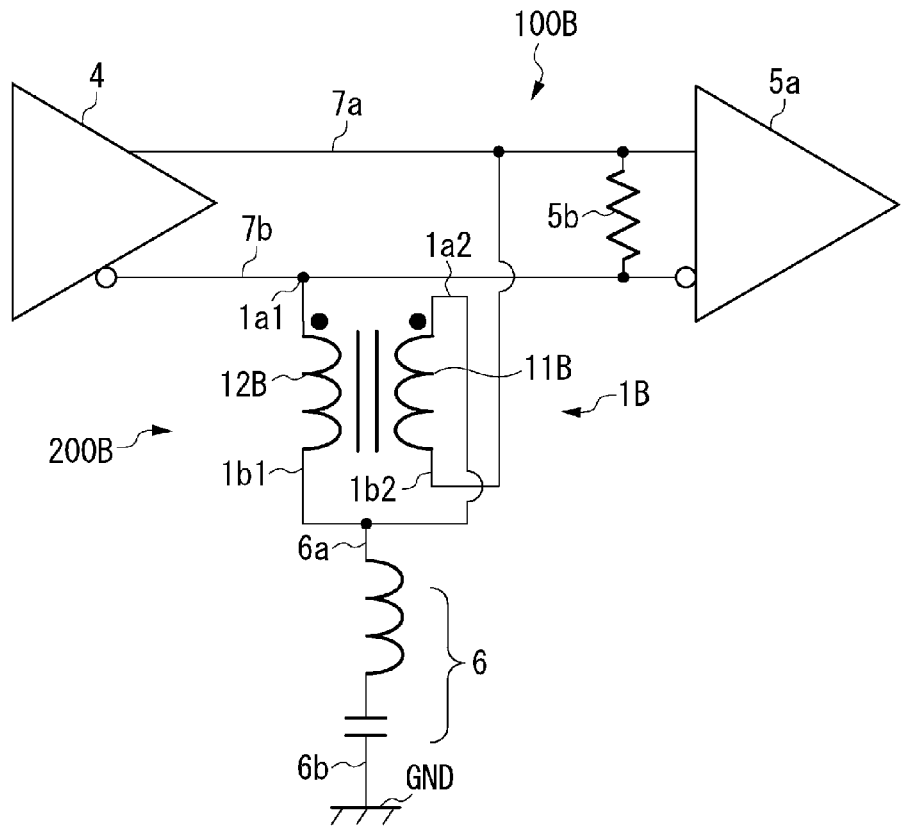
FIG. 3A is a circuit diagram of the transmission device according to a second exemplary embodiment.

A transmission device 100B illustrated in FIG. 3A includes a noise filter 200B. The configuration of the four-terminal circuit of the noise filter 200B is different from that of the noise filter 200 of the first exemplary embodiment. A four-terminal circuit 1B illustrated in FIG. 3A includes a pair of coils 12B and 11B for a common mode filter. The coil 12B includes an input terminal 1a1 and an output terminal 1b1. The coil 11B includes an input terminal 1a2 and an output terminals and 1b2.

Generally, wire wounded or multilayered common mode filter is arranged so that the magnetic flux increases with respect to an in-phase component of a differential signal and decreases with respect to an opposite-phase component. Thus, by changing the connection of one input/output terminal pair, for example, by changing the connection of the output terminal 1b2, which is electrically continuous in series with the input terminal 1a2, magnetic coupling having lower impedance of the in-phase component and higher impedance of the opposite-phase component is realized.

As described above, one end of the coil 12B is the input terminal 1a1 and the other end is the output terminal 1b1. Further, one end of the coil 11B is the output terminal 1b2 and the other end is the input terminal 1a2. The output terminal 1b2 of the coil 11B is connected to the transmission line 7a and the input terminal 1a1 of the coil 12B is connected to the transmission line 7b.

Further, the output terminal 1b1 of the coil 12B and the input terminal 1a2 of the coil 11B are electrically short-circuited. One end 6a of the series circuit 6 is electrically connected to the output terminal 1b1 and the input terminal 1a2, and an end 6b being the other end of the series circuit 6 is electrically connected to the GND.

Accordingly, the pair of coils 11B and 12B is in such a magnetic coupling state that the magnetic flux is cancelled out regarding the in-phase component which is transmitted through the pair of transmission lines 7a and 7b, and increased regarding the opposite-phase component which is transmitted through the pair of transmission lines 7a and 7b.

In this manner, the four-terminal circuit 1B, which is a generally-used common mode filter, functions as a differential mode filter just as the four-terminal circuit 1A functions in the first exemplary embodiment. Accordingly, the component cost can be reduced and, further, noise at the target frequency of the in-phase component of the differential signal can be rejected as the target frequency is rejected in the first exemplary embodiment.

Regarding the pair of coils 11B and 12B of a common mode filter, it is desirable to select coils with little loss. The reason is that although reducing the impedance of the in-phase component between the transmission lines 7a and 7b and the GND at the resonance frequency increases the noise rejecting effect, the factor that determines the lower limit of the impedance at the resonance frequency is the loss.

Generally, loss of coils with lower common mode impedance is smaller since the number of winding can be reduced or the length of pattern used for the multilayer can be short. Thus, although not limited, it is desirable to use coils whose impedance is 100 ohms or lower at 100 MHz.

Figure 3B:
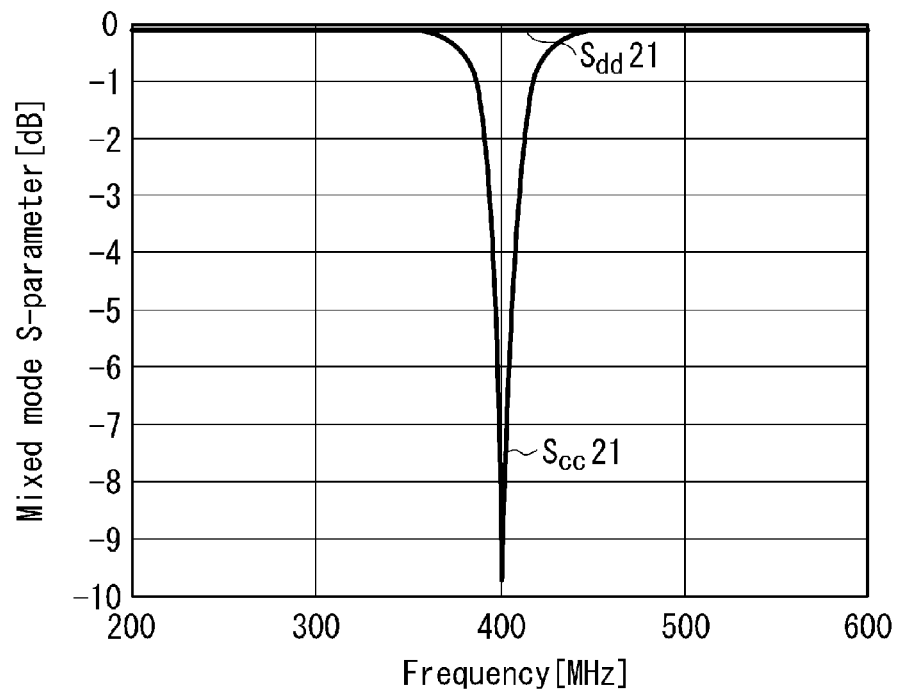
FIG. 3B is a graph illustrating a calculation result of the mixed-mode s-parameters of the transmission device according to the second exemplary embodiment.

FIG. 3B illustrates a simulation result of the mixed-mode s-parameters of the electric circuit illustrated in the circuit diagram in FIG. 3A. The transmission data rate is 400 Mbps and the target frequency is 400 MHz. The inductance $L_3$ of the inductor 2 is 37.79 nH and the capacitance of the capacitor 3 is 3.979 pF.

The inductance $L_{1A}$ of the four-terminal circuit 1A in the common mode is 2 nH and the combined inductance L of the inductor 2 and the four-terminal circuit 1A is 39.79 nH. Further, the differential termination circuit (terminating resistance) 5b is 100 ohms. Since the value of the equivalent series inductance of the capacitor 3 is extremely small, it is ignored in the calculation.

Scc21 illustrated in FIG. 3B denotes a transmission characteristic of the in-phase component from the input side to the output side. Sdd21 is a transmission characteristic of the opposite-phase component. According to FIG. 3B, although the opposite-phase component is transmitted without being attenuated, the in-phase component is rejected at the band of the target frequency.

Example 3

Next, the transmission device including the noise filter according to a third exemplary embodiment of the present invention will be described with reference to FIGS. 4A to 4C. According to the present exemplary embodiment, components similar to those in the first exemplary embodiment are denoted by the same reference numerals and their descriptions are not repeated.

If a plurality of frequencies that cause a noise exist, a plurality of resonance frequencies will be necessary. Thus, regarding a transmission device 100C according to the third exemplary embodiment, a plurality of noise filters are provided for the transmission lines 7a and 7b. For example, as illustrated in FIG. 4A, two noise filters 200 and 200' are provided.

As is the case with the noise filter 200, the noise filter 200' includes a four-terminal circuit 1A' including a pair of coils, and a series circuit 6' including an inductor 2' and a capacitor 3'. However, the value of each combined inductance and the value of each capacitance are different.

In other words, with respect to the target frequencies which are different to each other, a plurality (two according to the present exemplary embodiment) resonance frequencies are set by the noise filters 200 and 200'. Thus, as illustrated in FIG. 4C, the noise rejecting effect at each resonance frequency can be obtained.

Next, a transmission device including a different noise filter will be described with reference to FIG. 4B. A noise filter 200D of a transmission device 100D illustrated in FIG. 4B includes, as is the case with the first exemplary embodiment, the four-terminal circuit 1A which includes the pair of coils 11 and 12.

Further, the noise filter 200D includes a plurality of series circuits each of which includes an inductor and a capacitor which are connected in series between the pair of coils 11 and 12 and the GND. To be more specific, the noise filter 200D includes the series circuit 6 including the inductor 2 and the capacitor 3 connected in series between the pair of coils 11 and 12 and the GND.

Further, the noise filter 200D includes the series circuit 6' including the inductor 2' and the capacitor 3' which are connected in series between the pair of coils 11 and 12 and the GND. In other words, the series circuit 6' is parallelly connected with the series circuit 6. Thus, each combined inductance is determined according to the effective inductance of the in-phase component of the coils 11 and 12 and the inductance of each of the inductors 2 and 2'.

Further, the resonance frequency set for the in-phase component of the four-terminal circuit 1A and the series circuit 6' is different from the resonance frequency set for the in-phase component of the four-terminal circuit 1A and the series circuit 6.

In other words, each value of the combined inductance and each capacitance value of the capacitors are set so that a plurality (two for the present exemplary embodiment) of resonance frequencies have different target frequencies. Accordingly, an effect similar to the effect obtained from the noise filters 200 and 200' illustrated in FIG. 4A can be obtained.

Further, the impedance between the transmission lines 7a and 7b of the four-terminal circuit 1A with respect to the opposite-phase component of the differential signal necessary in the differential transmitting is higher than the impedance of the differential termination circuit 5b. Thus, as illustrated in FIG. 4C, even if the series circuits 6 and 6' are arranged, they virtually do not affect the transmission waveform.

Figure 4A:
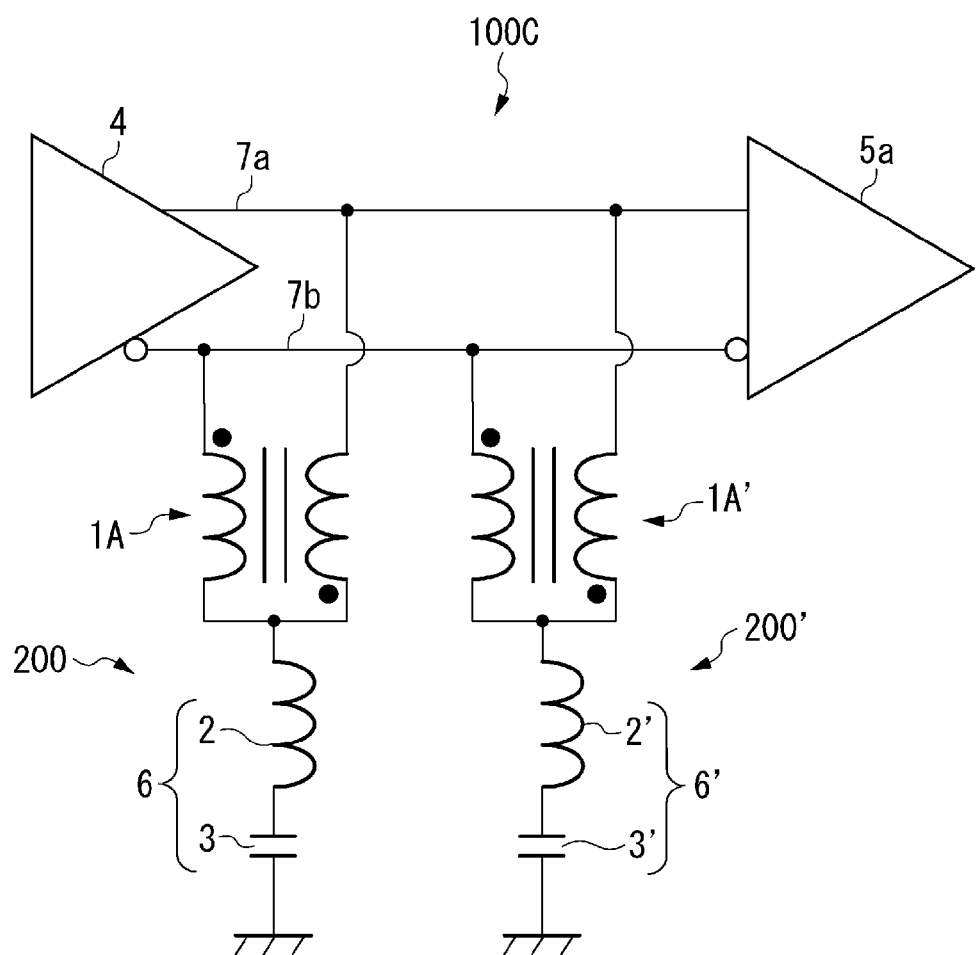
FIG. 4A is a circuit diagram of the transmission device according to a third exemplary embodiment.
Figure 4B:
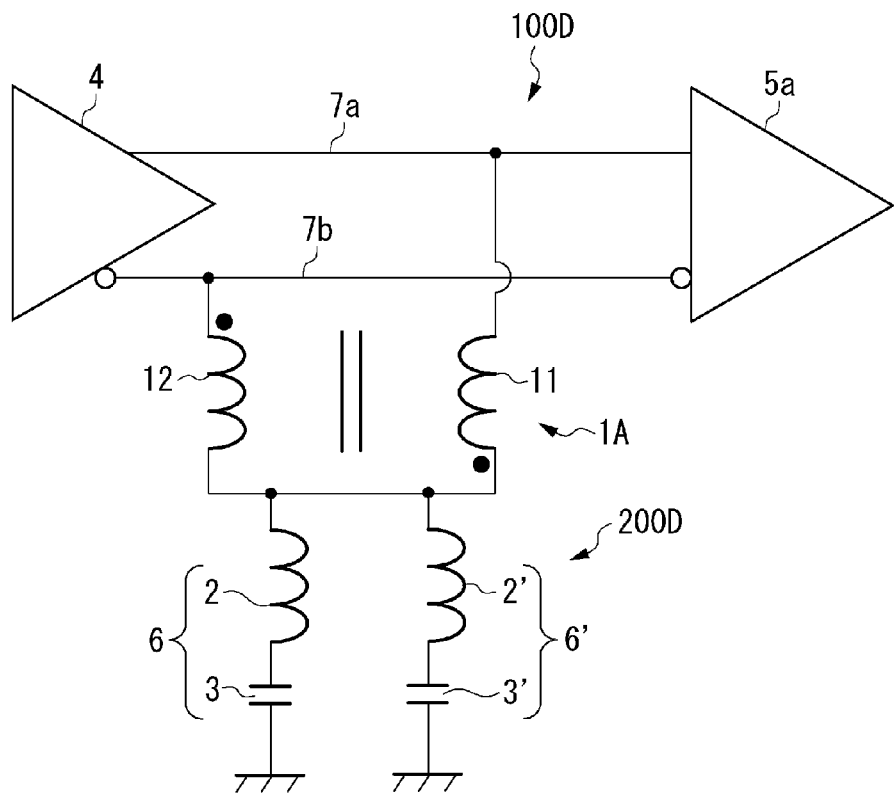
FIG. 4B is a circuit diagram of the transmission device according to the third exemplary embodiment.
Figure 4C:
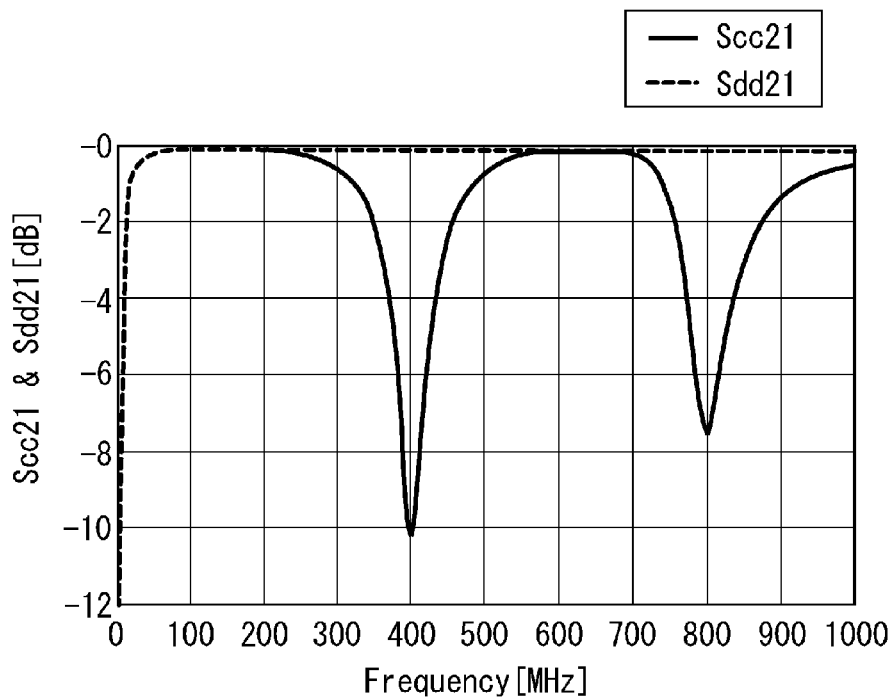
FIG. 4C is a graph illustrating a calculation result of mixed-mode s-parameters of the transmission device according to the third exemplary embodiment.

Although FIGS. 4A and 4B are circuit diagrams regarding two frequencies, by parallelly connecting a noise filter to the transmission lines 7a and 7b or by parallelly connecting a plurality of series circuits to the series circuit, a circuit for two or more frequencies can be similarly realized. Further, a combination of these circuits can be used.

Further, even if the winding or the lamination of the common mode filter is such that the impedance of the in-phase component is high and the impedance of the opposite-phase component is low, such a common mode filter can be used if the connection is adequate.

According to the noise filter 200D, by newly connecting the series circuit 6' in parallel to the series circuit 6 which is connected in series to the four-terminal circuit 1A, the noise rejecting effect for a plurality of frequencies at one four-terminal circuit 1A can be obtained.

Example 4

A noise filter according to a fourth exemplary embodiment of the present invention will be described with reference to FIGS. 5A to 5C. According to the present exemplary embodiment, components similar to those in the first exemplary embodiment are denoted by the same reference numerals and their description is not repeated.

Figure 5A:
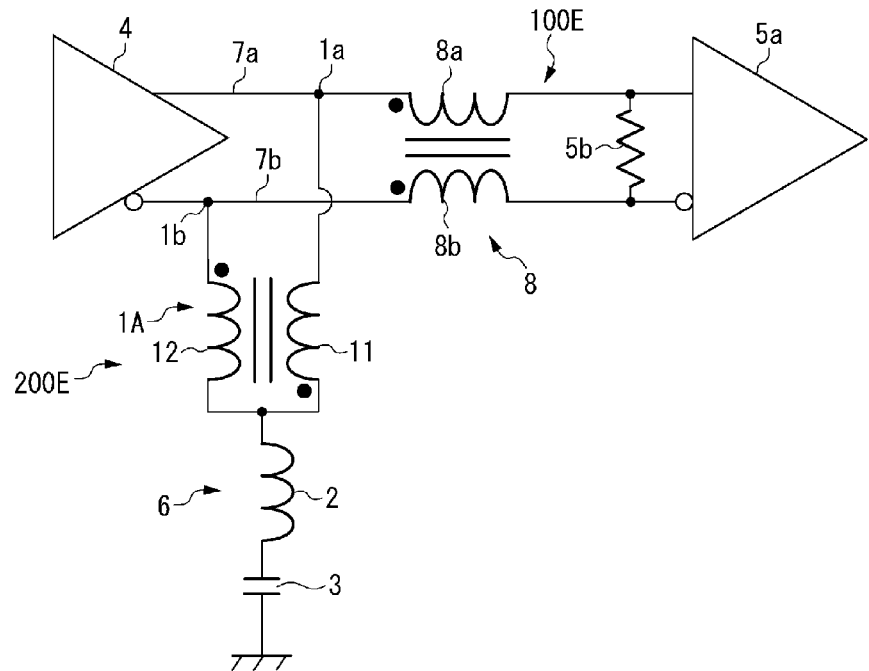
FIG. 5A is a circuit diagram of the transmission device according to a fourth exemplary embodiment.

According to the present exemplary embodiment, as illustrated in FIG. 5A, a noise filter 200E of a transmission device 100E includes the four-terminal circuit 1A including the pair of coils 11 and 12 and the series circuit 6 including the inductor 2 and the capacitor 3 as is the case with the noise filter 200 according to the first exemplary embodiment.

The noise filter 200E includes a common mode filter 8. The common mode filter 8 is provided between the pair of transmission lines 7a and 7b and between the ends 1a and 1b of the pair of coils 11 and 12 and the receiving circuit 5a. Further, the common mode filter 8 rejects the transmission of the in-phase component to the receiving circuit 5a.

The common mode filter 8 includes a pair of coils 8a and 8b being a pair of winding wires. Winding or lamination is performed to realize such a magnetic coupling state that the magnetic flux is increased for the in-phase component of the differential signal and decreased for the opposite-phase component of the differential signal. The coil 8a is connected in series with the transmission line 7a, and the coil 8b is connected in series with the transmission line 7b.

The common mode filter 8 is desirably a common mode filter having a high impedance of the in-phase component in a frequency range of about 30 MHz to a few tenths of GHz over 1 GHz.

The common mode filter 8 functions so that the opposite-phase component of the differential signal has low impedance and the in-phase component, which causes EMI, has high impedance. Thus, the noise being the in-phase component passes through the pair of coils 11 and 12 and the series circuit 6. Accordingly, the noise can be rejected in an effective manner.

Figure 5B:
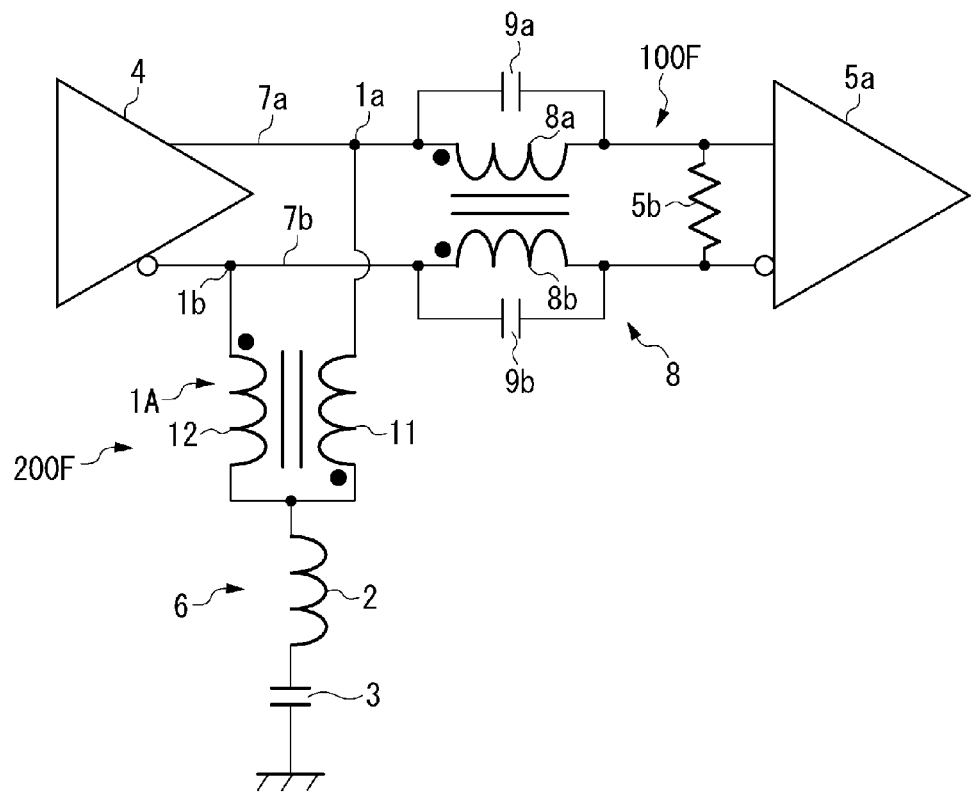
FIG. 5B is a circuit diagram of the transmission device according to the fourth exemplary embodiment.

Further, as another exemplary embodiment of the present invention, in order to increase the noise rejecting effect at the target frequency, a noise filter 200F of a transmission device 100F illustrated in FIG. 5B has capacitors 9a and 9b connected in parallel to each of the coils 8a and 8b of the common mode filter 8. Capacitance $C_C$ of the capacitors 9a and 9b, which are parallelly connected, can be obtained according to the following equation (3).

[Math.3]

$$C_C = 2 \frac{1}{L_C \omega_C^2} \quad (3)$$

Where the capacitance $C_C$ is the capacitance of the capacitors 9a and 9b which are added, $L_C$ is the effective inductance of the in-phase component of the common mode filter 8, and omega$_c$ is a target angular frequency. It is desirable if the capacitors 9a and 9b, which are connected to the transmission lines 7a and 7b, have a same capacitance value. The capacitance $C_C$ is set to such a value that the capacitance $C_C$ of each of the capacitors 9a and 9b resonates at a frequency same as the resonance frequency of the pair of coils 11 and 12 and the series circuit 6.

Figure 5C:
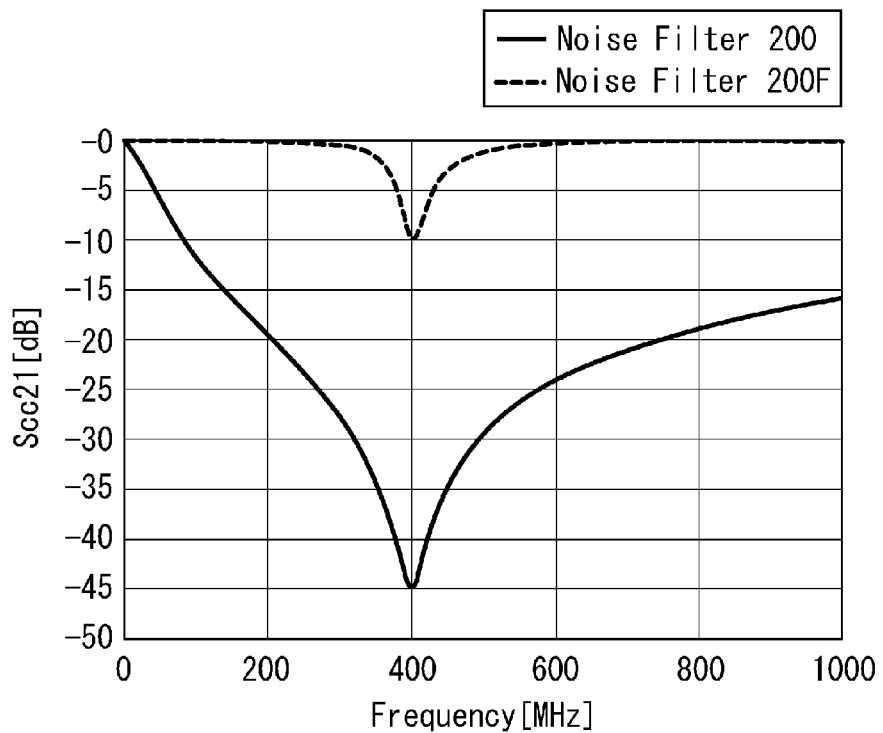
FIG. 5C is a graph illustrating a calculation result of mixed-mode s-parameters of the transmission device according to the fourth exemplary embodiment.
Figure 6A:
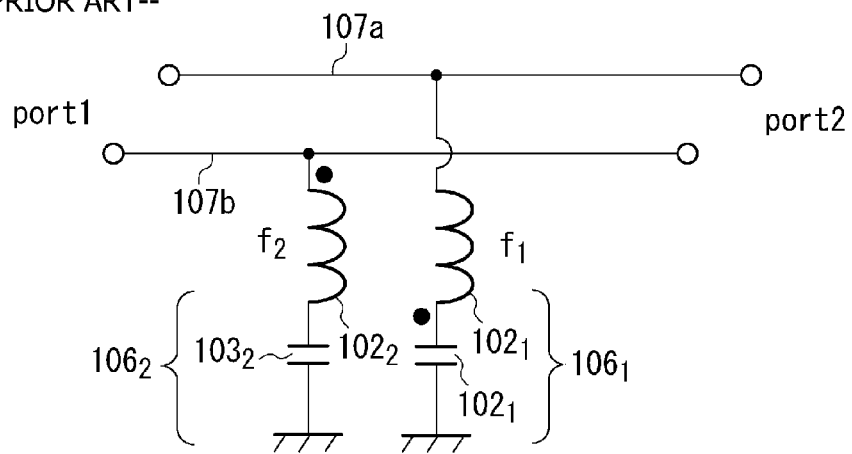
FIG. 6A is circuit diagram of the transmission device including a conventional noise filter.
Figure 6B:
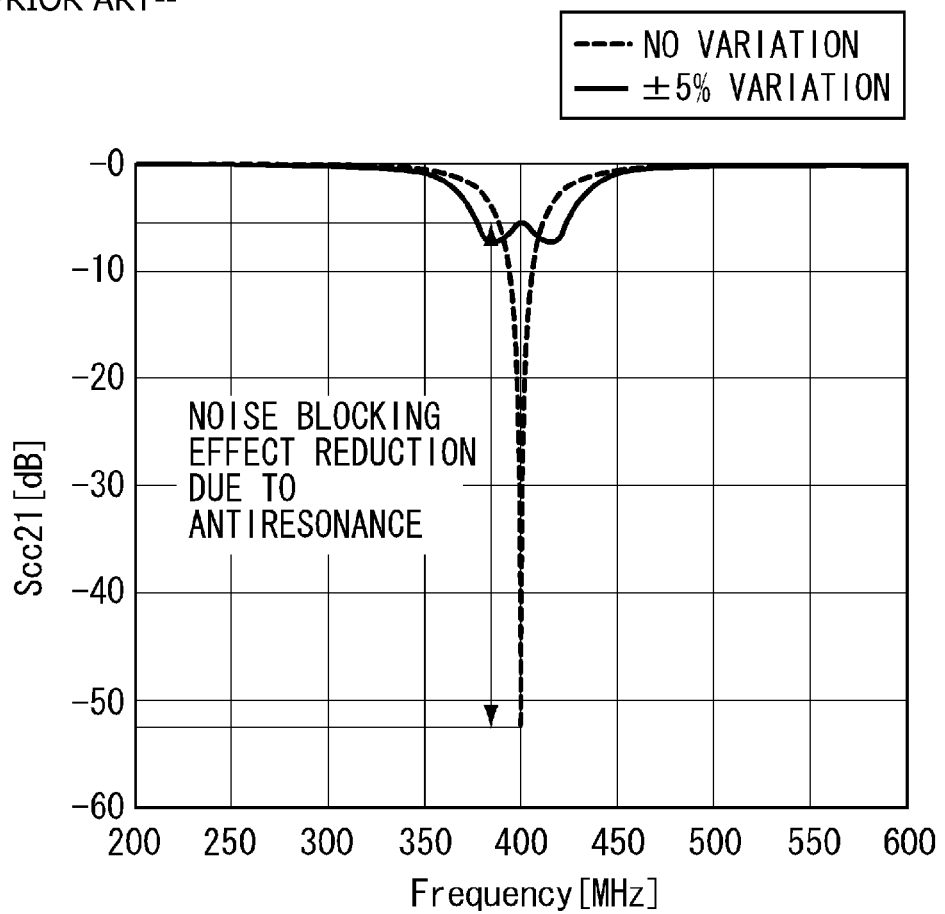
FIG. 6B is a graph illustrating a calculation result of mixed-mode s-parameters of the transmission device using a conventional noise filter.

FIG. 5C is a graph illustrating a simulation result of the mixed-mode s-parameters in the circuit diagrams illustrated in FIGS. 5A and 5B. The transmission data rate is 400 Mbps and the target frequency is 400 MHz. The inductance $L_3$ of the inductor 2 is 37.79 nH and the capacitance of the capacitor 3 is 3.979 pF.

The inductance $L_{1A}$ of the four-terminal circuit 1A in the common mode is 2 nH, and the combined inductance L of the inductor 2 and the four-terminal circuit 1A is 39.79 nH. Further, the differential termination circuit (terminating resistance) 5b is 100 ohms. Further, the inductance of the coils 8a and 8b is 400 nH. The coils 8a and 8b are tightly coupled at a coupling coefficient of 0.999999999.

Further, the capacitance of the capacitors 9a and 9b is 0.05 pF. Since the values of the equivalent series inductance of the capacitors 3, 9a, and 9b are extremely small, they are ignored in the calculation. As illustrated in FIG. 5C, since the common mode filter 8 and the capacitors 9a and 9b having higher impedance than the in-phase signal component are added to the noise filter 200F, the reject effect of the in-phase component (noise) of the noise filter 200F is greater than the reject effect of the noise filter 200 of the first exemplary embodiment.

Thus, since the noise filter 200F includes the common mode filter 8 and the capacitors 9a and 9b, higher impedance of the in-phase component of the target frequency of the filter circuit is realized. Thus, the effect for preventing the noise propagation to the receiving circuit 5a regarding the target frequency is increased and the noise can be furthermore rejected in an effective manner.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-214396 filed Sep. 24, 2010, which is hereby incorporated by reference herein in its entirety.

The invention claimed is:

1. A filter provided on a pair of transmission lines connecting a transmitting circuit configured to transmit a differential signal and a receiving circuit configured to receive the differential signal, the filter comprising:
   a pair of coils;
   an inductor; and
   a capacitor;
   wherein one end of one coil of the pair of coils is connected to one transmission line of the pair of transmission lines in the vicinity of the transmitting circuit;
   wherein one end of the other coil of the pair of coils is connected to the other transmission line of the pair of transmission lines in the vicinity of the transmitting circuit;
   wherein respective other ends of the pair of coils are short-circuited,
   wherein the pair of coils are in a magnetic coupling state in which magnetic fluxes of an in-phase component that is transmitted on the pair of transmission lines are cancelled with each other and magnetic fluxes of an opposite-phase component that is transmitted on the pair of transmission lines are increased with each other,
   wherein the inductor and the capacitor are a series circuit connected in series with the pair of coils and a ground,
   wherein a resonance frequency of the in-phase component of the pair of coils and the series circuit is set within a frequency band,
   the frequency band including a frequency corresponding to a one bit period of the differential signal, and having a bandwidth of 10% of the frequency corresponding to the one bit period of the differential signal, or
   the frequency band including an integer multiple of the one bit period of the differential signal, and having a bandwidth of 10% of the integer multiple of the one bit period of the differential signal.

2. The noise filter according to claim 1, wherein the series circuit comprises a plurality of series circuits, the plurality of the series circuits being provided between the pair of coils and a ground.

3. The filter according to claim 1, wherein a common mode filter that prevents passing of the in-phase component to the receiving circuit is provided between a position where the respective one end of the pair of coils is connected to the corresponding one transmission line of the pair of transmission lines and the receiving circuit.

4. The filter according to claim 3, wherein the common mode filter further comprises a pair of common mode coils; wherein a filter capacitor respectively connected in parallel with each coil of the common mode filter is set to such a capacitance value that the respective filter capacitor resonates at a frequency which is the same as the resonance frequency.

5. A transmission device comprising:
a transmitting circuit;
a receiving circuit;
a pair of transmission lines configured to connect the transmitting circuit and the receiving circuit and transmit a differential signal; and
a filter provided on the pair of transmission lines; wherein the filter includes:
a pair of coils;
an inductor; and
a capacitor;
wherein one end of one coil of the pair of coils is connected to one transmission line of the pair of transmission lines in the vicinity of the transmitting circuit;
wherein one end of the other coil of the pair of coils is connected to the other transmission line of the pair of transmission lines in the vicinity of the transmitting circuit;
wherein respective other ends of the pair of coils are short-circuited, and
wherein magnetic fluxes of an in-phase component that transmits the pair of transmission lines are cancelled with each other, and magnetic fluxes of an opposite-phase component that transmits the pair of transmission lines are increased with each other,
wherein the inductor and the capacitor are a series circuit connected in series with the pair of coils and a ground, and wherein a resonance frequency of the in-phase component of the pair of coils and the series circuit is set within a frequency band,
the frequency band including a frequency corresponding to a one bit period of the differential signal, and having a bandwidth of 10% of the frequency corresponding to the one bit period of the differential signal, or
the frequency band including an integer multiple of the one bit period of the differential signal, and having a bandwidth of 10% of the integer multiple of the one bit period of the differential signal.

6. The transmission device according to claim 5, wherein the series circuit comprises a plurality of series circuits, the plurality of the series circuits being provided between the pair of coils and the ground.

7. The transmission device according to claim 5, wherein a plurality of the filters are connected in parallel along the pair of transmission lines.

8. The transmission device according to claim 5, wherein, a common mode filter configured to prevent the in-phase component from passing through the receiving circuit is provided along the pair of transmission lines between positions where the respective one end of the pair of coils is connected to the corresponding one transmission line of the pair of transmission lines and the receiving circuit.

9. The transmission device according to claim 8, wherein the common mode filter further comprises a pair of common mode coils; wherein a filter capacitor respectively connected in parallel with each coil of the common mode filter is set to such a capacitance value that the respective filter capacitor resonates at a frequency same as the resonance frequency.

* * * * *